United States Patent
Ehbing et al.

(10) Patent No.: US 9,412,893 B2
(45) Date of Patent: Aug. 9, 2016

(54) SOLAR MODULE AND PROCESS FOR PRODUCTION THEREOF

(75) Inventors: Hubert Ehbing, Shanghai (CN); Frithjof Hannig, Düsseldorf (DE); Stephanie Vogel, Langenfeld (DE); Nusret Yuva, Burscheid (DE); Wolfgang Fischer, Meerbusch (DE); Helmut Kuczewski, Kamp-Lintfort (DE); Ernst-Ulrich Reisner, Moers (DE)

(73) Assignee: Bayer Intellectual Property GmbH (DE)

( * ) Notice: Subject to any disclaimer, the term of this patent is extended or adjusted under 35 U.S.C. 154(b) by 69 days.

(21) Appl. No.: 14/240,954

(22) PCT Filed: Aug. 22, 2012

(86) PCT No.: PCT/EP2012/066331
§ 371 (c)(1),
(2), (4) Date: Feb. 25, 2014

(87) PCT Pub. No.: WO2013/030062
PCT Pub. Date: Mar. 7, 2013

(65) Prior Publication Data
US 2014/0209171 A1   Jul. 31, 2014

(30) Foreign Application Priority Data
Aug. 26, 2011   (DE) .......................... 10 2011 053 030

(51) Int. Cl.
| | | |
|---|---|---|
| *H01L 31/00* | (2006.01) | |
| *H01L 21/00* | (2006.01) | |
| *H01L 31/18* | (2006.01) | |
| *C08G 18/81* | (2006.01) | |
| *C08G 18/44* | (2006.01) | |
| *C08L 75/16* | (2006.01) | |
| *H01L 31/048* | (2014.01) | |

(52) U.S. Cl.
CPC ................ *H01L 31/18* (2013.01); *C08G 18/44* (2013.01); *C08G 18/8175* (2013.01); *C08L 75/16* (2013.01); *H01L 31/0481* (2013.01); *Y02E 10/50* (2013.01)

(58) Field of Classification Search
CPC .......................... H01L 31/048; H01L 31/0481
See application file for complete search history.

(56) References Cited

U.S. PATENT DOCUMENTS

| | | | |
|---|---|---|---|
| 3,782,961 A | 1/1974 | Takahashi et al. | |
| 4,225,695 A | 9/1980 | Schuster et al. | |
| 5,076,958 A | 12/1991 | Pedain et al. | |
| 6,320,115 B1 * | 11/2001 | Kataoka et al. | ............... 136/251 |
| 6,505,795 B1 * | 1/2003 | Thompson et al. | ........ 244/172.6 |
| 7,132,459 B1 | 11/2006 | Buechel | |
| 8,993,706 B2 | 3/2015 | Schubert et al. | |
| 2003/0075210 A1 * | 4/2003 | Stollwerck et al. | ........... 136/243 |
| 2003/0134928 A1 | 7/2003 | Sulzbach et al. | |
| 2004/0235977 A1 | 11/2004 | Bulluck et al. | |
| 2006/0079660 A1 | 4/2006 | Ludewig et al. | |
| 2006/0116502 A1 | 6/2006 | Gurtler et al. | |
| 2006/0201545 A1 * | 9/2006 | Ovshinsky et al. | ........... 136/251 |
| 2007/0131274 A1 | 6/2007 | Stollwerck et al. | |
| 2009/0062500 A1 | 3/2009 | Ludewig et al. | |
| 2009/0229664 A1 * | 9/2009 | Appadurai | .................... 136/261 |
| 2009/0255571 A1 * | 10/2009 | Xia et al. | ...................... 136/251 |
| 2010/0104979 A1 | 4/2010 | Dietliker et al. | |
| 2010/0243033 A1 * | 9/2010 | Brouwer et al. | ............... 136/246 |
| 2011/0155222 A1 * | 6/2011 | Ehbing et al. | ................. 136/251 |
| 2012/0225519 A1 * | 9/2012 | Ehbing et al. | .................. 438/73 |
| 2012/0318354 A1 * | 12/2012 | Zhao et al. | ..................... 136/259 |

FOREIGN PATENT DOCUMENTS

| | | |
|---|---|---|
| CN | 1208055 A | 2/1999 |
| CN | 102067329 A | 5/2011 |
| DE | 1644798 U | 10/1952 |
| DE | 2 115 373 A1 | 10/1971 |
| DE | 2 737 406 A1 | 2/1979 |
| DE | 10 2004 057916 A1 | 6/2006 |
| DE | 10 2007 015261 A1 | 10/2008 |
| DE | 102009014348 A1 | 12/2009 |
| DE | 10 2008 062286 A1 | 6/2010 |
| DE | 102009010990 A1 | 8/2010 |
| EP | 0336205 A2 | 10/1989 |
| EP | 1081179 A2 | 3/2001 |
| EP | 1302988 A2 | 4/2003 |
| EP | 1645582 A1 | 4/2006 |
| EP | 2031003 A1 | 3/2009 |
| EP | 2289972 A1 | 3/2011 |
| EP | 2444435 A1 | 4/2012 |
| WO | WO-00/23493 A1 | 4/2000 |
| WO | WO-01/55240 A1 | 8/2001 |
| WO | WO 2010/094425 | 8/2010 |
| WO | WO 2011039299 A2 * | 4/2011 |

OTHER PUBLICATIONS

International Search Report for PCT/EP2012/066331 mailed Jan. 3, 2013.

* cited by examiner

*Primary Examiner* — Eli Mekhlin
(74) *Attorney, Agent, or Firm* — Drinker Biddle & Reath LLP

(57) ABSTRACT

The present invention relates to a solar module comprising a first layer, a solar cell arranged above the first layer and a second layer arranged above the solar cell. The first and/or the second layer comprise a fiber composite material which comprises a preferably aliphatic polyurethane polymer "dual cure" system) crosslinked thermally and by means of electromagnetic radiation. The material of the fibers of the fiber composite material is transparent at least in the region of visible light. The invention further relates to the use of this type of solar module and to a process for production thereof.

10 Claims, No Drawings

SOLAR MODULE AND PROCESS FOR PRODUCTION THEREOF

CROSS-REFERENCE TO RELATED APPLICATIONS

This application is a national stage application (under 35 U.S.C. §371) of PCT/EP2012/066331, filed Aug. 22, 2012, which claims benefit of German application 10 2011 053 030.4, filed Aug. 26, 2011.

The present invention relates to a solar module comprising a first layer, a solar cell arranged above the first layer and a second layer arranged above the solar cell. The invention further relates to the use of this type of solar module and to a process for production thereof.

A solar module usually comprises a framed composite made of a pane of glass, of a transparent plastics layer, of mono- or polycrystalline solar cells and of reverse-side encapsulation.

The pane of glass serves as front cover, for protection from mechanical and weathering effects. It must have very high transparency, in order to minimize absorption losses in the visible spectral region and thus to minimize efficiency losses. The usual method uses a single pane of safety glass (ESG) which has high resistance to temperature variations.

The solar cells are embedded into the transparent plastics layer. EVA (ethylene-vinyl acetate) foils or silicone rubbers are mostly used. They serve for the adhesive bonding of the entire module composite. The solar cells made of silicon are connected electrically to one another by solder strips. The reverse side of the composite is composed of a weathering-resistant plastics composite foil for example made of polyvinyl fluoride or polyester.

The manufacture of a solar element mostly begins with the pane of glass. An EVA foil is applied to the appropriately cleaned glass. The connected solar cells are positioned on the pane with the EVA foil. The entire structure is then covered with a further EVA foil and the reverse-side foil. During a lamination procedure at about 150° C. the EVA foil melts, flows into the interstices of the soldered solar cells and is thermally crosslinked. The EVA foil, hitherto milky, forms a clear, three-dimensionally crosslinked plastics layer that is no longer fusible and in which the solar cells have now been embedded and securely bonded to the pane of glass and to the reverse-side foil. Formation of air bubbles, which lead to reflection losses, is avoided by lamination in vacuo. The reverse side of the module, composed of composite foil, protects the solar cell and the embedding material from moisture and oxygen. Moisture or oxygen can cause corrosion of the metal contacts and chemical degradation of the EVA embedding material.

Solar elements can also be used in the field of lightweight-construction aircraft. Solar laminates are one example here, and are a composite made of transparent barrier foils and two layers of a hardened epoxide prepreg. Between the epoxide prepregs there are encapsulated crystalline solar cells. The manufacture of this type of solar laminate begins with the provision of the barrier foil. A first layer of the epoxide prepreg is placed onto the said foil. The solar cells, soldered to give strings, are then positioned and electrically connected. After a further layer of epoxide prepreg and a further barrier foil has been applied, the lay-up is hardened at increased temperature and reduced pressure (removal of included air) and permanently bonded.

The construction of composite elements can in principle also involve types of fibre ("fiber") composite elements in which the resin is a UV-curing aliphatic urethane acrylate. In this connection, EP 1 081 179 A2 discloses a foil-type photocurable resin-compound material comprising a photocurable resin-compound material (i) comprising, as essential component, at least one unsaturated resin (A) selected from the group consisting of an unsaturated polyester resin, of a vinyl ester resin, of a vinyl urethane resin and of an acrylate resin, a photopolymerization initiator (B) which is not activated by irradiation with light with a wavelength of 420 nm or above, and a tackifier (C) comprising a thermoplastic resin powder as active component; and a transparent light-absorption film (ii) which has transmittance of 10% or less for light with a wavelength of 420 nm or below; where the transparent light-absorption film covers the photocurable resin-compound material.

WO 2000/23493 A1 relates to a process for the production of technical mouldings, consumer items and articles based on a polyurethane material preferably made of (meth)acrylate comprising isocyanate and hydroxy groups with at least 0.5 mmol/g content of reactive double bonds-determinable by a DSC method, where a mixture of all of the starting components is produced in a first process stage and, by methods known per se in plastics technology, in particular by casting, pressing, rolling or extrusion, is converted to a desired form and simultaneously or subsequently is subjected to a non-free-radical triggered polyaddition reaction (urethane reaction), in such a way as to produce therefrom a polyurethane material in the form of a flexible, optionally elastic preform that can be deformed without any removal of material. In a second process stage, the preform is subjected to further, preferably mechanical, shaping and to substantially emission-free curing by free-radical polymerization of the free double bonds. The publication also relates to the products produced by the said process, and also to the many different possible uses of these, optionally directly at the point of use, for the production of high-strength mouldings and composite elements, in particular for applications in the fields of medicine (e.g. surgery, orthopaedics, dentistry), technology (e.g. civil engineering, the construction industry, motor vehicle production, insulation technology, measurement technology and lighting technology), domestic applications, cosmetics and fine arts.

WO 01/55240 A1 relates to a process for the production of free-radically post-crosslinked polymers. In a first stage here, one or more compounds (a) which are reaction products of epoxidized fatty acid esters and/or of epoxidized triglycerides with acrylic acid and/or methacrylic acid are converted to the corresponding polyurethanes (a*) by reaction with aliphatic and/or aromatic isocyanates and the resultant polyurethanes (a*) are then radically post-crosslinked in a second stage in the presence of at least one free-radical initiator (b). The resultant polymers are said to be excellent matrix materials for composite materials.

US 2004/0235977 A1 discloses a UV-curable formulation for the repair of composite materials, comprising an acrylic oligomer, an acrylic polymer and a photoinitiator. The formulation can comprise glass fibres. The photoinitiator can be a combination of a bisacylphosphine oxide and of an α-hydroxy ketone. The formulation can harden rapidly, for example in about 20 minutes. The glass transition temperature of the hardened formulation can be above 150° C.

As described above, the lamination procedure for the production of solar modules uses epoxy resin prepregs under reduced pressure and at elevated temperature. The hardening of the prepreg composite requires a number of hours and is the process step that determines the manufacturing time. It is therefore an object of the present invention to develop a material and a process which permits markedly quicker manufacture of lightweight-construction solar laminates.

According to the invention, the said object is achieved via a solar module comprising a first layer, a solar cell arranged above the first layer and a second layer arranged above the solar cell, where the first and/or the second layer comprise a fibre composite material which comprises a polyurethane polymer crosslinked thermally and by means of electromagnetic radiation and where the material of the fibres of the fibre composite material is transparent at least in the region of visible light.

The fibre composite material of the first and/or second layer comprises a polyurethane polymer which has been crosslinked, i.e. hardened, not only thermally but also by means of electromagnetic radiation. It is preferable that the electromagnetic radiation involves UV light with a wavelength of from 100 nm to 420 nm. To this extent it is also possible to characterize the polyurethane polymer as what is known as a "dual cure" system. The advantage of a "dual cure" systems is that, in comparison with the usual epoxy resin systems, the processing time needed to obtain the hardened resin is shorter. The fibres of the fibre composite material can take the form of a woven fabric, of a laid string, of a knitted fabric or of a non-woven. It is also moreover possible that individual fibres are present. However, preference is given to woven fibres. Examples of suitable diameters for the individual fibres are from ≥1 μm to ≤100 μm. By way of example, glass fibres can be used as material for the fibres of the fibre composite material.

The material of the fibres of the fibre composite material is moreover transparent at least in the region of visible light. Transparency in the region of visible light means that the average transmittance is ≥80% for light of wavelength from ≥380 nm to ≤780 nm. It is preferable that the average transmittance is ≥88% in the said wavelength region. To this extent, by way of example glass fibres would in principle be suitable under the preconditions mentioned, whereas carbon fibres would be unsuitable.

It is preferable that the material of the fibres of the fibre composite material is also transparent in the region of ultraviolet light. This means that the average transmittance is ≥80% for light of wavelength from ≥200 nm to <380 nm. It is preferable that the average transmittance is ≥88% in the said wavelength region.

The transmittance can be measured with a suitable spectrometer with a photometer sphere by a method based on the standards ASTM E 01348/ISO 13468/ASTM D 1003 (lamp type and observer: D65 10°).

Solar cells that can be used are commercially available mono- or polycrystalline silicon cells, thin-layer cells (for example amorphous silicon), semiconductor cells (for example CdTe, CIS, GaAs), organic solar cells or dye-sensitized solar cells (DSSC) and the like.

In a simple form of the solar module, the first and the second layer are in direct contact with the solar cell. However, it is equally possible that the arrangement has, between the solar cell and the first and/or the second layer, further layers such as protective layers or barrier layers. Examples of further layers of this type are glass layers or other transparent materials. It is also possible that there are further layers, for example protective layers or barrier layers, attached on that side of the first and/or of the second layer that faces away from the solar cell. Figuratively speaking, another encapsulation material then replaces the (hardened) prepregs. An advantage here is better mechanical properties of the composite. The difference in the thermal expansion in relation to glass or in relation to the solar cell would be smaller than in the case of elastomeric (EVA) systems. The fibre structure would moreover stabilize the cells during lay-up. This would prevent slippage.

In the event that only the first layer or only the second layer comprises the fibre composite material, the other of the two layers can also be a protective layer or a barrier layer.

In another case that is included according to the invention, the arrangement has a plurality of solar cells between the first and the second layer.

Preferred embodiments of the present invention are described below. They can be combined with one another in any desired manner, unless the context clearly implies the opposite.

In one embodiment of the solar module, the polyurethane polymer is an aliphatic polyurethane polymer. The aliphatic polymers, preferably entirely without aromatic monomers, ensure good transparency and light-resistance.

In another embodiment of the solar module, the polyurethane polymer is obtained from the reaction of a mixture comprising a linear, aliphatic polyester polyol, a first, aliphatic urethane (meth)acrylate with an OH number of ≤10 mg KOH/g (DIN 53240) and a second, aliphatic urethane (meth)acrylate containing isocyanate groups. Preferred linear polyester polyols are polycarbonate polyols.

Examples of suitable linear, aliphatic polycarbonate polyols are those polycarbonates having hydroxy groups, preferably polycarbonatediols, with number-average molar masses $M_n$ of from 400 to 8000 g/mol, particularly preferably from 600 to 3000 g/mol. These can be obtained by reaction of carbon dioxide or carbonic acid derivatives, such as diphenyl carbonate, dimethyl carbonate or phosgene, with polyols, preferably diols.

Examples of these diols are ethylene glycol, 1,2- and 1,3-propanediol, 1,3- and 1,4-butanediol, 1,6-hexanediol, 1,8-octanediol, neopentyl glycol, 1,4-bishydroxymethylcyclohexane, 2-methyl-1,3-propanediol, 2,2,4-trimethyl-1,3-pentaendiol, dipropylene glycol, polypropylene glycols, dibutylene glycol, polybutylene glycols, bisphenol A and lactone-modified diols of the abovementioned type.

It is preferable that the diol component comprises from 40 to 100% by weight of hexanediol, preference being given to 1,6-hexanediol and/or hexanediol derivatives. These hexanediol derivatives are based on hexanediol and have ester groups or ether groups alongside terminal OH groups. These derivatives can be obtained by reaction of hexanediol with excess caprolactone or by etherification of hexanediol with itself to give the di- or trihexylene glycol.

Instead, or in addition to, pure polycarbonate diols it is also possible to use polyether polycarbonatediols. Polycarbonates having hydroxy groups preferably have a linear structure.

Examples of suitable second urethane (meth)acrylates containing isocyanate groups are compounds which are produced from alcohols having (meth)acryloyl groups and from di- or polyisocyanates. Production processes for urethane (meth)acrylates are in principle known and are described by way of example in DE-A-1 644 798, DE-A-2 115 373 or DE-A-2 737 406. For the urethane (meth)acrylates of the invention having free isocyanate groups, the molar ratio of NCO groups of the di- or polyisocyanates to OH groups of the alcohols having (meth)acryloyl groups and, where appropriate, the OH groups of the diol having ester groups is generally from 1:0.2 to 1:0.8, preferably from 1:0.3 to 1:0.6. It is also possible to use a mixture of a urethane (meth)acrylate which comprises no free NCO groups with urethane (meth)acrylate having free isocyanate groups, as long as the said mixture corresponds to the abovementioned ratio of NCO groups to OH groups in its units.

The expression alcohols having (meth)acryloyl groups means esters which are derived from acrylic acid or methacrylic acid with polyhydric alcohols and which have free hydroxy groups. These in particular involve esters of acrylic acid and methacrylic acid with dihydric alcohols, for example 2-hydroxyethyl, 2- or 3-hydroxypropyl or 2-, 3- or 4-hydroxybutyl(meth)acrylate, or else any desired mixture of compounds of this type. It is moreover also possible to use monohydric alcohols having (meth)acryloyl groups or reaction products essentially consisting of alcohols of this type where these compounds are obtained by esterification of n-hydric alcohols with (meth)acrylic acid, where alcohols that can also be used are mixtures of different alcohols, where n is an integer or, being a statistical average, a non-integer of greater than 2 to 4, preferably 3, and where the number of mols of (meth)acrylic acid used per mole of the alcohols mentioned is from (n-0.6) to (n-2.2), preferably (n-0.8) to (n-1.2), particularly preferably (n-1).

Among the said compounds of mixtures are by way of example the reaction products of glycerol, trimethylolpropane and/or pentaerythritol, of low-molecular-weight alkoxylation products of alcohols of this type, for example of ethoxylated or propoxylated trimethylolpropane, for example the adduct of ethylene oxide onto trimethylolpropane with the OH number 550 mg KOH/g, or of any desired mixture of at least trihydric alcohols of this type with dihydric alcohols, for example ethylene glycol or propylene glycol, with (meth)acrylic acid in the molar ratio mentioned. The molar mass of these compounds is generally from 116 to 1000 g/mol, preferably from 116 to 750 g/mol and particularly preferably from 116 to 158 g/mol.

It is moreover possible to use the reaction products of these monohydric alcohols containing (meth)acryloyl groups with ε-caprolactone. Preference is given here to the reaction products of hydroxyalkyl(meth)acrylates such as 2-hydroxyethyl, 2- or 3-hydroxypropyl or 2-, 3- or 4-hydroxybutyl(meth)acrylate with ε-caprolactone. The molar mass of these compounds is generally from 230 to 3000 g/mol, preferably from 230 to 1206 g/mol and particularly preferably from 344 to 572 g/mol.

Preferred di- or polyisocyanates are butylene diisocyanate, hexamethylene diisocyanate (HDI), isophorone diisocyanate (IPDI), trimethylhexamethylene diisocyanate (2,2,4- and/or 2,4,4-trimethylhexamethylene diisocyanate), di(isocyanatocyclohexyl)methane, isocyanatomethyloctane 1,8-diisocyanate or derivatives of these having urethane structure, isocyanurate structure, allophanate structure, biuret structure, uretdione structure, or iminooxadiazinedione structure and mixtures of the same.

Preference is given to polyisocyanates which have urethane groups and which have isocyanurate structural units based on diisocyanates and on diols having ester groups, production of these being described by way of example in EP-A-336 205.

The addition reaction of the isocyanate-containing constituent with the alcohol-containing constituent to give the urethane (meth)acrylate can be accelerated in a manner known per se by means of suitable catalysts such as tin octoate, dibutyltin dilaurate or tertiary amines The resultant urethane (meth)acrylate having free NCO groups can be stabilized to counter premature polymerization, generally by addition of suitable inhibitors and antioxidants such as phenols and hydroquinones and where appropriate also quinones such as 2,5-di-tert-butylquinone. The amounts added of the said inhibitors are in each case from 0.001 to 0.3% by weight during or after the production process.

Examples of suitable first, aliphatic urethane (meth)acrylates with an OH number of ≤10 mg KOH/g can be obtained by analogy with the urethane (meth)acrylates described above, where the molar ratios of the reactants are selected in a way that minimizes, in the final product, the number of groups reactive towards isocyanates. This is expressed via the stated OH number, which covers not only OH groups but also amino groups, etc., and is preferably ≤5 mg KOH/g, more preferably ≤1 mg KOH/g. Binders of this type are described by way of example in P. K. T. Oldring (Ed.), Chemistry & Technology of UV & EB Formulations For Coatings, Inks & Paints, Vol. 2, 1991, SITA Technology, London, pp. 31-235.

It is preferable that the linear, aliphatic polycarbonate polyol is a polycarbonate polyester polyol with hydroxy content of ≤4% and with an equivalent weight of from ≥450 to ≤1000, more preferably with an equivalent weight of from ≥450 to ≤550.

It is further preferable that the first, aliphatic urethane acrylate comprises allophanate structures. The production of allophanate-urethane acrylates of this type is described by way of example in EP 1645582 or EP 2031003. Preference is given to products which are produced with use of monomeric diisocyanates, and very particular preference is given to those in which hexamethylene diisocyanate (HDI) is used. Suitable (meth)acrylic esters bearing hydroxy groups comprise those already mentioned above. Hydroxyalkyl(meth)acrylates and reaction products of the said hydroxyalkyl(meth)acrylates with ε-caprolactone are in particular suitable.

It is also preferable that the second, aliphatic urethane (meth)acrylate containing isocyanate groups comprises, as constituent, an amount of from ≥1% by weight to ≤65% by weight, based on the amount of other constituents of the urethane (meth)acrylate, of a diol which has ester groups and which has an average molar mass of from ≥176 g/mol to ≤2000 g/mol. The diol having ester groups here can be either a constituent of the alcohols having (meth)acryloyl groups, a constituent of the polyisocyanates or else can be another constituent.

Preferred starting materials are 1,6-diisocyanatohexane and polyesterdiols of average molar mass from 176 to 2000 g/mol, preferably from 350 to 950 g/mol, particularly preferably from 500 to 800 g/mol. These involve polyesterdiols known per se, composed of diols and dicarboxylic acids. Examples of suitable diols for the production of the polyesterdiols are dimethylolcyclohexane, ethanediol, 1,2- and 1,3-propanediol, 1,2-, 1,3- and 1,4-butanediol and neopentyl glycol. Preference is given to mixtures of this with 1,6-hexanediol, and particular preference is given to 1,6-hexanediol as sole diol component. Examples of suitable dicarboxylic acids are aromatic dicarboxylic acids such as phthalic acid, isophthalic acid and terephthalic acid, cycloaliphatic dicarboxylic acids such as hexahydrophthalic acid, tetrahydrophthalic acid, and also anhydrides thereof and aliphatic dicarboxylic acids, which are preferably used, for example succinic acid, glutaric acid, adipic acid, suberic acid, azelaic acid and sebacic acid, and also anhydrides thereof. It is also possible to react any desired mixture of the examples mentioned of starting materials, or to use any desired mixture of the reaction products. However, it is particularly preferable to use polyesterdiols made of ε-caprolactone in the molar mass range mentioned which have been produced in a manner known per se from ε-caprolactone and, as starter molecule, a diol of the type mentioned by way of example above. It is preferable here to use 1,6-hexanediol as starter molecule.

ε-caprolactonediols started on 1,6-hexanediol and having a very narrow oligomer distribution are very particularly preferred as component, and this option can be realized via use of boron trifluoride etherate or of organic tin compounds as polymerization catalyst. These very particularly preferred esterdiols are composed of more than 50% by weight of molecules in the molar mass range from 460 to 802 g/mol.

The liquid mixture for the production of the PU polymer advantageously comprises photoinitiators. Any of the commercially available photoinitiators is in principle suitable, in particular α-hydroxyphenylketones.

The NCO-free component of the liquid mixture for the production of the PU polymer optionally comprises adhesion improvers. These adhesion improvers have acid groups, preference being given to products having carboxy moieties or having phosphoric acid moieties, particular preference being given to products having (meth)acryloyl groups and carboxy groups, and, respectively, (meth)acryloyl groups and phosphoric acid groups.

The diol having ester groups can also be added as further constituent during the production of the urethane (meth)acrylates.

In another embodiment of the solar module, the refractive index $n_D^{20}$ of the polyurethane polymer is from ≥95% to ≤105% of the refractive index $n_D^{20}$ of the material of the fibres. The said refractive index is preferably in the range from ≥98% to ≤102% of the refractive index $n_D^{20}$ of the material of the fibres, more preferably from ≥99% to ≤101% and most preferably from ≥99.5% to ≤100.5%. This appropriate selection of the refractive indices can reduce or eliminate losses at the boundary between polymer and fibre when light is incident on the solar module, thus permitting improvement of overall efficiency.

In another embodiment of the solar module, the proportion present of the fibres is from ≥5% by volume to ≤70% by volume in the fibre composition material of the first and/or the second layer. The said content is preferably from ≥20% by volume to ≤50% by volume.

In another embodiment of the solar module, the fibres of the fibre composite material take the form of a woven fabric. The weight per unit area of the woven fabric comprising the fibres can by way of example be in the range from ≥15 g/m² to ≤500 g/m².

In another embodiment of the solar module, the first and the second layer enclose the solar cell. The solar cell is thus protected from mechanical and environmental effects.

In another embodiment of the solar module, this also comprises one or more barrier layers in order to reduce the permeation of water and/or oxygen. Suitable barrier layers are inter alia polyvinyl fluoride foils and polyester foils, and also glass layers. These barrier layers can protect the solar cells and in particular their contacts from corrosion.

The invention also provides the use of a solar module of the invention for the production of aircraft wings, aircraft propellers and/or wind-turbine blade systems.

The present invention further provides a process for the production of a solar module of the invention, comprising the following steps:
(i) provision of a solar cell;
(ii) provision of a first prepreg and of a second prepreg, where the first and/or the second prepreg comprise fibres of which the material is transparent at least in the region of visible light and moreover the said prepreg(s) comprise a reaction mixture which after heating and exposure to electromagnetic radiation is capable of forming a crosslinked polyurethane polymer;
(iii) heating that/those prepreg(s) which comprise the reaction mixture mentioned in step (ii);
(iv) arrangement of the solar cell between the first prepreg and the second prepreg; and
(v) exposure of that/those prepreg(s) from step (iii) to electromagnetic radiation, so that a crosslinked polyurethane polymer is obtained from the reaction mixture.

Details of the individual component materials used in the process have already been mentioned in connection with the solar module.

The process of the invention can by way of example be carried out by using two prepregs with a "dual cure" polyurethane system (preferably the same system).

According to step (iii), the prepregs are heated. The background to this is that the intention is to increase the viscosity of the reaction mixture in order to obtain a semifinished part with good processability. The heating can by way of example be carried out to a temperature of from ≥50° C. to ≤100° C. The duration of the heating can by way of example be from ≥5 minutes to ≤2 hours. A catalyst for the NCO/OH reaction can optionally be added in order to achieve a large reduction in the heating time.

In step (iv), lamination of the solar cell takes place, where either the solar cell is brought into direct contact with the previously provided and treated prepregs or else one or more intermediate layers can also have been provided on one side, or on both sides, of the solar cells.

The exposure to electromagnetic radiation in step (v) for the final crosslinking of the polymer is advantageously carried out by means of UV radiation, for example at from 254 to 420 nm.

The product obtained is a solar module laminate, the production time required for which is markedly shorter than with the epoxy-resin-based prepregs used hitherto.

Before the final crosslinking in step (v) it is also possible, if desired, to apply a vacuum in order to remove problematic air inclusions in the laminate. It is equally possible to apply a superatmospheric pressure for this purpose. This can by way of example be achieved by means of a pressure bag. It is preferable that the pressure bag has been designed so as to be transparent in order to permit passage of UV radiation. Hardening of the prepreg can then take place while superatmospheric pressure is applied.

In one embodiment of the process, the polyurethane polymer is an aliphatic polyurethane polymer.

In another embodiment of the process, the reaction mixture comprises a linear, aliphatic polycarbonate polyester, a first aliphatic urethane acrylate and a second urethane acrylate containing isocyanate groups. In order to avoid repetition of information including that relating to preferred components, reference is made to what has been said in relation to the solar module.

In another embodiment of the process, the fibres take the form of a woven fabric. Here again, in order to avoid repetition reference is made to what has been said in relation to the solar module.

The examples below provide a more detailed description of the present invention, which is not however restricted thereto.

GLOSSARY

DESMOPHEN® C 1100: solvent-free, linear, aliphatic polycarbonate polyester polyol having 3.3±0.3% hydroxy content (DIN 53240/2) and an equivalent weight of about 500

DESMOLUX® VP LS 2265: unsaturated aliphatic urethane acrylate without reactive diluent having ≤0.3% OH group content, comprising polyether structures DESMOLUX® XP 2740: unsaturated aliphatic urethane acrylate without reactive diluent having ≤0.3% OH group content, comprising allophanate structures DESMOLUX® XP 2683/1: unsaturated aliphatic urethane acrylate without reactive diluent having ≤0.3% OH group content, comprising polyester structures DESMOLUX® VP LS 2396: urethane acrylate containing isocyanate groups without reactive diluent having about 7.5% NCO group content (DIN EN ISO 11 909)

IRGACURE® 2959: photoinitiator

EBECRYL® 168: adhesion promoter (meth-/acylylated acid derivative)

The components were processed in accordance with the proportions by weight stated in the table below to give "dual cure" systems:

| Example No. | 1 | 2 | 3 | 4 |
|---|---|---|---|---|
| Component A (parent coating material) | | | | |
| DESMOPHEN® C 1100 (OH) | 27.37 | 27.37 | 27.37 | 26.06 |
| DESMOLUX® VP LS 2265 | 41.05 | — | — | — |
| DESMOLUX® XP 2740 | — | 41.05 | — | 39.10 |
| DESMOLUX® XP 2683/1 | — | — | 41.05 | — |
| IRGACURE® 2959 | 2.11 | 2.11 | 2.11 | 2.01 |
| EBECRYL® 168 | — | — | — | 4.76 |
| Component B (hardener) | | | | |
| Desmolux® VP LS 2396 (NCO) | 29.47 | 29.47 | 29.47 | 28.07 |
| TOTAL | 100.00 | 100.00 | 100.00 | 100.00 |
| Mixing ratio (parent coating material/hardener) | 2.39:1 | 2.39:1 | 2.39:1 | 2.56:1 |

Production of Solar Modules:

Component A and component B were stirred together manually in a ratio of 2.39:1 and then applied using a manual roll system (amount applied 250 g/m²) to two woven glass-fibre fabrics (HEXFORCE® 00106 1270 TF952 CC BT from Hexcel, weight per unit area 25 g/m²). A Teflon sheet was used as substrate. The Teflon sheets together with the resultant woven glass fabrics with applied UV coating material were then cured thermally for 45 minutes at 80° C. The thermally cured impregnated woven glass fabrics are then separated from the Teflon sheets and silicon wafers are embedded between two layers of the impregnated woven fabrics. The system obtained above was cured by a free-radical route on both sides with the aid of UV lamps (Hg, 80 W/cm, web speed about 5 m/min).

Determination of Refractive Indices:

Refractive indices $n_D$ at 589 nm and transmittance values were determined from the thermally and photochemically hardened coating materials, and also from thermally and photochemically hardened woven glass-fibre fabrics impregnated with the coating materials (likewise HEXFORCE® 00106 1270 TF952 CC BT from Hexcel, weight per unit area 25 g/m²). Refractive indices were measured either in a Abbé refractometer or with a transmitted-light interference microscope. The transmittance values were measured with a Perkin Elmer Lambda 900 spectrometer With a photometer sphere by a method based on the standard ASTM E 01348/ISO 13468/ASTM D 1003 (lamp type and observer: D65) 10°. A HALAR® foil (ECTFE foil, Solvay) and a hardened epoxy resin prepreg were used for comparison. The tables below have listed the results.

| Example No. | Comparison | Comparison | Invention 1 | Invention 1 |
|---|---|---|---|---|
| Resin from Example | | | 1 | 1 |
| Note | Halar® foil | Epoxide prepreg | Dual-cure PU resin foil | Dual-cure PU prepreg |
| Woven glass-fibre fabric | [—] | One layer | [—] | One layer |
| $n_D$ (589 nm) | 1.45** | 1.5993** | 1.4975* | 1.4975** |
| Transmittance [%] | 93.26 | 89.69 | 91.63 | 89.72 |

*measured with an Abbé refractometer
**measured with a transmitted-light interference microscope

| Example No. | Invention 2 | Invention 2 | Invention 3 | Invention 3 |
|---|---|---|---|---|
| Resin from Example | 2 | 2 | 3 | 3 |
| Note | Dual-cure PU resin foil | Dual-cure PU resin foil | Dual-cure PU resin foil | Dual-cure PU prepreg |
| Woven glass-fibre fabric | [—] | One layer | [—] | One layer |
| $n_D$ (589 nm) | 1.4948** | 1.4948** | 1.5012* | 1.5012** |
| Transmittance [%] | 91.52 | 91.96 | 91.62 | 89.95 |

*measured with an Abbé refractometer
**measured with a transmitted-light interference microscope According to the invention, there is a markedly small difference in the refractive indices not only with respect to the glass (fibres and possible cover glass; refractive index assumed to be 1.5) but also with respect to the HALAR® foil. The level of reflections is reduced and higher transparency is obtained (for low-angle radiation incident on a solar module).

The invention claimed is:

1. A solar module comprising a first layer, a solar cell arranged above the first layer and a second layer arranged above the solar cell,
   wherein the first and/or the second layer comprise a fiber composite material which comprises a polyurethane polymer crosslinked thermally and by means of electromagnetic radiation and where the material of the fibers of the fiber composite material is transparent at least in the region of visible light; and
   wherein the polyurethane polymer is obtained from a reaction of a mixture comprising (1) a linear, aliphatic polyester polyol (2) a first aliphatic urethane (meth)acrylate with an OH number of ≤10 tug KOH/g and (3) a second, aliphatic urethane meth(acrylate) containing isocyanate groups.

2. The solar module according to claim 1, wherein the linear, aliphatic polycarbonate polyol is a polycarbonate polyester polyol with hydroxy content of ≤4% and with an equivalent weight of from ≥450 to ≤550.

3. The solar module according to claim 1, wherein the first, aliphatic urethane acrylate comprises allophanate structures.

4. The solar module according to claim 1, wherein the second, aliphatic urethane (meth)acrylate containing isocyanate groups comprises, as constituent, an amount of from ≥1% by weight to ≤65% by weight, based on the amount of other constituents of the urethane (meth)acrylate, of a diol which has ester groups and which has an average molar mass of from ≥176 g/mol to ≤2000 g/mol.

5. The solar module according to claim 1, wherein the refractive index nD20 of the polyurethane polymer is from ≥95% to ≤105% of the refractive index nD20 of the material of the fibres fibers.

6. The solar module according to claim 1, wherein the proportion present of the fibers is from ≥5% by volume to ≤70% by volume in the fiber composite material of the first and/or of the second layer.

7. The solar module according to claim 1, wherein the fibers in the fiber composite material take the form of a woven fabric.

8. The solar module according to claim 1, wherein the first and the second layer enclose the solar cell.

9. The solar module according to claim 1, which further comprises one or more barrier layers in order to reduce the permeation of water and/or oxygen.

10. A process for the production of a solar module comprising a first layer, a solar cell arranged above the first layer and a second layer arranged above the solar cell, wherein the first and/or the second layer comprise a fiber composite material which comprises a polyurethane polymer crosslinked thermally and by means of electromagnetic radiation and where the material of the fibers of the fiber composite material is transparent at least in the region of visible light, the process comprising the following, steps:

(i) providing the solar cell;
(ii) providing a first prepreg and a second prepreg, where the first and/or the second prepreg comprise fibers of which the material is transparent at least in the region of visible light and moreover the said prepreg(s) comprise a reaction mixture which after heating and exposure to electromagnetic radiation is capable of forming a crosslinked polyurethane polymer;
(iii) heating that/those prepreg(s) which comprise the reaction mixture mentioned in step (ii);
(iv) arranging the solar cell between the first prepreg, and the second prepreg; and
(v) exposing that/those prepreg(s) from step (iii) to electromagnetic radiation, so that a crosslinked polyurethane polymer is obtained from the reaction mixture, wherein the reaction mixture comprises a linear, aliphatic polycarbonate polyester, a first aliphatic urethane acrylate and a second urethane acrylate containing isocyanate groups.

* * * * *